US008827686B2

(12) United States Patent
Shiraishi et al.

(10) Patent No.: US 8,827,686 B2
(45) Date of Patent: Sep. 9, 2014

(54) IMPRINTING APPARATUS AND IMPRINT TRANSFER METHOD (75) Inventors: Toshimitsu Shiraishi, Kamisato (JP); Naoaki Yamashita, Kamisato (JP); Masashi Aoki, Kamisato (JP)

(73) Assignee: Hitachi High-Technologies Corporation, Tokyo (JP)

( * ) Notice: Subject to any disclaimer, the term of this patent is extended or adjusted under 35 U.S.C. 154(b) by 159 days.

(21) Appl. No.: 13/189,759

(22) Filed: Jul. 25, 2011

(65) Prior Publication Data
US 2012/0025419 A1 Feb. 2, 2012

(30) Foreign Application Priority Data

Jul. 27, 2010 (JP) ................................. 2010-168314

(51) Int. Cl.
B29C 59/02 (2006.01)
B82Y 40/00 (2011.01)
B82Y 10/00 (2011.01)
G03F 7/00 (2006.01)
B29C 43/10 (2006.01)
B29C 43/02 (2006.01)

(52) U.S. Cl.
CPC ............... G03F 7/0002 (2013.01); B82Y 40/00 (2013.01); B82Y 10/00 (2013.01); B29C 43/10 (2013.01); B29C 43/021 (2013.01)
USPC ........... 425/385; 425/110; 425/117; 425/128; 425/157; 425/174.4; 425/352; 425/355; 425/405.1; 425/419

(58) Field of Classification Search
USPC .............. 425/110, 117, 128, 157, 174.4, 352, 425/355, 385, 405.1, 419
See application file for complete search history.

(56) References Cited

U.S. PATENT DOCUMENTS 5,378,134 A * 1/1995 Blot et al. ...................... 425/149
6,030,576 A * 2/2000 Cassani ........................ 264/570
(Continued)

FOREIGN PATENT DOCUMENTS

JP    2003-516644    5/2003
JP    2006-326927    12/2006
(Continued)

OTHER PUBLICATIONS

Office Action of JP 2010-168314 dated Aug. 6, 2013.
International Search Report of Appln. No. PCT/JP2011/066918 dated Nov. 8, 2011 in English.

Primary Examiner — Robert B Davis
(74) Attorney, Agent, or Firm — Antonelli, Terry, Stout & Kraus, LLP.

(57) ABSTRACT

The present invention provides an imprinting apparatus or an imprint transfer method in which uniformity of curing quality by UV light is maintained and a uniform application thickness of a UV curable resin is achieved, even if glass is contaminated with dust and/or smudges or has a flaw. A feature of the present invention resides in an imprinting apparatus or an imprint transfer method that, while irradiating an transferred object with energy, transfers a concavo-convex configuration on a stamper's surface onto the transferred object and, subsequently, detaches the stamper from the transferred object, the imprint transfer method including: pressurizing a first reverse surface of at least one of the stamper and the transferred object with a planar pressurizing body having a flat surface configuration; subsequently, pressurizing a second reverse surface of at least one of the stamper and the transferred object with a fluid; and controlling pressurization timing of pressurization by the planar pressurizing body and pressurization by the fluid, thus completing the transfer.

8 Claims, 6 Drawing Sheets (56) References Cited

U.S. PATENT DOCUMENTS

| | | | |
|---|---|---|---|
| 7,195,734 B2 * | 3/2007 | Heidari | 264/667 |
| 2003/0159608 A1 | 8/2003 | Heidari | |
| 2007/0243281 A1 * | 10/2007 | Hasegawa et al. | 425/405.1 |
| 2008/0084006 A1 | 4/2008 | Gao et al. | |
| 2011/0180965 A1 * | 7/2011 | Zhang et al. | 264/293 |

FOREIGN PATENT DOCUMENTS

| | | |
|---|---|---|
| JP | 2007-083626 | 4/2007 |
| JP | 2007-287942 | 11/2007 |
| JP | 2010-506427 | 2/2010 |
| JP | 2010-099848 | 5/2010 |

* cited by examiner

IMPRINTING APPARATUS AND IMPRINT TRANSFER METHOD

FIELD OF THE INVENTION

The present invention relates to an imprinting apparatus and an imprint transfer method which implement pressurizing a stamper having particularly micro concavo-convex configuration on a surface thereof and an transferred object against each other and transferring the concavo-convex configuration of the stamper to a surface of the transferred object.

BACKGROUND OF THE INVENTION

Recently, imprint technology for producing micro patterns at a low cost has been proposed. This imprint technology is to press a stamper having concavo-convex pattern formed thereon (providing its surface configuration) which correspond to concavo-convex pattern intended to be produced against an transferred object, which is available, for example, as a given substrate covered with a resin layer, and can produce a micro pattern in the resin layer of the transferred object. Application of this imprint technology to forming a pattern of bits which are recorded in a large-capacity recording medium such as a hard disk and forming a pattern in a semiconductor integrated circuit is under consideration.

For an imprinting apparatus for use in a process of manufacturing a recording medium such as a hard disk, a stamper is needed as an original pattern plate for transfer. In a process of producing this stamper, the stamper is produced by transferring a master original pattern plate microfabricated by an electron beam fabrication device or the like to a resin layer over the stamper base material. This production method by transfer is implemented by using thermal imprint or optical imprint.

As for such conventional imprint technology, two types of transfer methods have been available to produce the stamper: a planar pressurization method (Japanese Laid-Open Patent Application No. 2010-99848) using a press with an optically polished flat surface of glass and a fluid pressurization method (Japanese Laid-Open Patent Application No. 2006-326927) using pressure of compressed clean air.

An advantage of the planar pressurization method is that a uniform application thickness of a UV curable resin is achieved by the press with the flat surface polished to a flatness of several 100 nm. On the other hand, this method has a disadvantage that, if a light source element which is just proximal to the pattern is contaminated with dust and/or smudges or has a flaw, ultraviolet (UV) light is blocked or affected by the contamination or flaw in the close vicinity of the pattern, which results in a deterioration in the uniformity of curing quality.

An advantage of the fluid pressurization method is that highly uniform curing quality is achieved, because clean air filtered to 100 nm or below is only present in the vicinity of a resin. On the other hand, a disadvantage of this method is that uniformity of an application thickness of the resin only relies on fluidity of the resin itself, because the resin is not pressed with a flat surface.

SUMMARY OF THE INVENTION

It is therefore an object of the present invention to provide an imprinting apparatus or an imprint transfer method in which uniformity of curing quality by UV light is maintained and a uniform application thickness of a UV curable resin is achieved, even if glass is contaminated with dust and/or smudges or has a flaw.

In order to attain the foregoing object, the present invention has at least the following features.

A first feature of this invention resides in an imprint transfer method that, while irradiating an transferred object with energy, transfers a stamper's surface concavo-convex configuration onto the transferred object and, subsequently, detaches the stamper from the transferred object, the imprint transfer method including: pressurizing a first reverse surface of at least one of the stamper and the transferred object with a planar pressurizing body having a flat surface configuration; subsequently, pressurizing a second reverse surface of at least one of the stamper and the transferred object with a fluid; and controlling pressurization timing of pressurization by the planar pressurizing body and pressurization by the fluid, thus completing the transfer.

A second feature is that the first reverse surface and the second reverse surface are an identical reverse surface.

A third feature is that the first reverse surface and the second reverse surface are different reverse surfaces.

A fourth feature is that the controlling is implemented to maintain the pressurization approximately at a predetermined pressure when the pressurization by the planar pressurizing body transits to the pressurization by the fluid.

A fifth feature is that the energy is heat or light.

According to the present invention, it is possible to provide an imprinting apparatus or an imprint transfer method in which uniformity of curing quality by UV light is maintained and a uniform application thickness of a UV curable resin is achieved, even if glass is contaminated with dust and/or smudges or has a flaw.

DETAILED DESCRIPTION OF THE PREFERRED EMBODIMENTS

Figure 1:
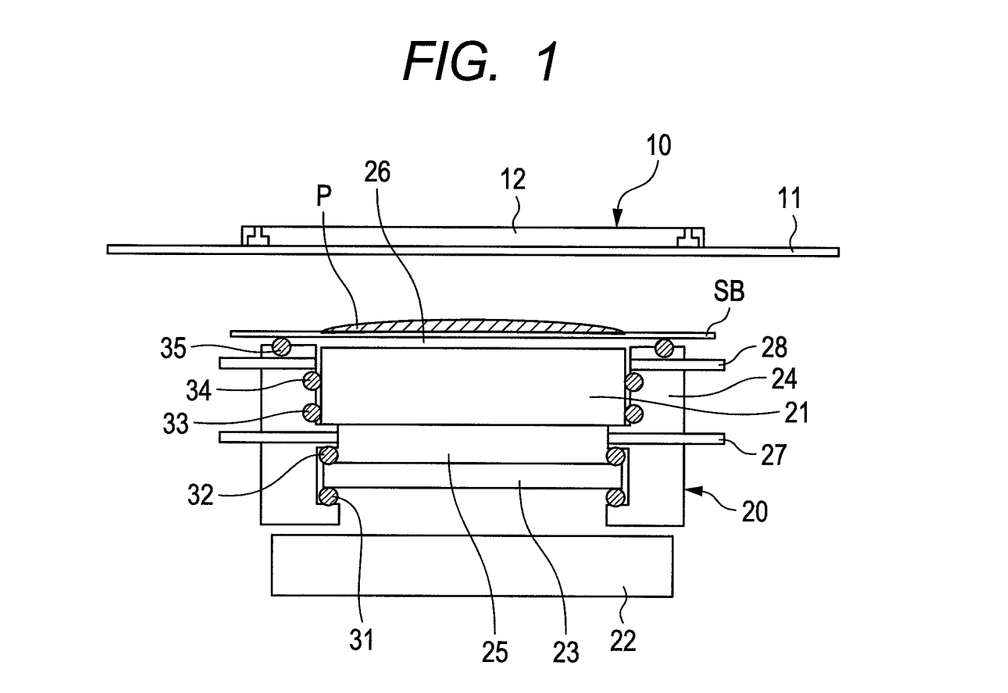
FIG. 1 shows a structural diagram of a first embodiment of an imprinting apparatus of the present invention.

Embodiments will be described using the drawings hereinafter. FIG. 1 shows a structural diagram of a first embodiment of an imprinting apparatus Ip.

The imprinting apparatus Ip is roughly divided into and includes a transfer device upper part 10 having components above a photo curable resin P which is a forming material of a stamper and a transfer device lower part 20 having components below the photo curable resin P. The transfer device upper part 10 includes an original pattern plate 11 that is the stamper and a suction plate 12 which keeps the original pattern plate 11 flat and suctions and holds it. The suction plate 12 is supported by an actuator (not shown) which is to move in a vertical direction in the figure.

On the other hand, the transfer device lower part 20 includes a planar pressurizing body 21 made of glass which presses a stamper base material SB constituting an transferred object together with the photo curable resin P against the original pattern plate 11, a light source 22 which irradiates the photo curable resin P with UV light, an optical window 23 which is transmissive for the UL light, a planar pressurizing chamber 25 which is defined by the planar pressurizing body 21, the optical window 23, and a housing 24, piping for planar pressurization 27 which is firmly fixed to the housing 24 and injects compressed fluid into the planar pressurizing chamber 25, a fluid pressurizing chamber 26 which is defined by the stamper base material SB, the planar pressurizing body 21, and the housing 24, piping for fluid pressurization 28 which is firmly fixed to the housing 24 and injects compressed fluid into the fluid pressurizing chamber 26, and O rings 31 to 35 which seal the planar pressurizing chamber 25 and the fluid pressurizing chamber 26 in their boundary regions. O rings 31, 32, and 33 seal the planar pressurizing chamber 25 and O rings 34, 35 seal the fluid pressurizing chamber 26.

In the first embodiment, it is assumed that, if a pattern is imprinted onto the top surface of the transferred object, pressure is exerted on the reverse surface of the transferred object by the fluid pressurizing body and the compressed fluid.

The above embodiment remains unchanged in terms of its functionality and features, even if the transfer device upper part 10 and the transfer device lower part 20 are arranged upside down with respect to each other. It may be assumed that, if the top surface of the stamper that is the original pattern plate has a pattern, pressure is exerted on the reverse surface of the stamper by the fluid pressurizing body and the compressed fluid. Thus, a reasonable posture can be selected in designing manufacturing equipment as a whole.

Figure 2:
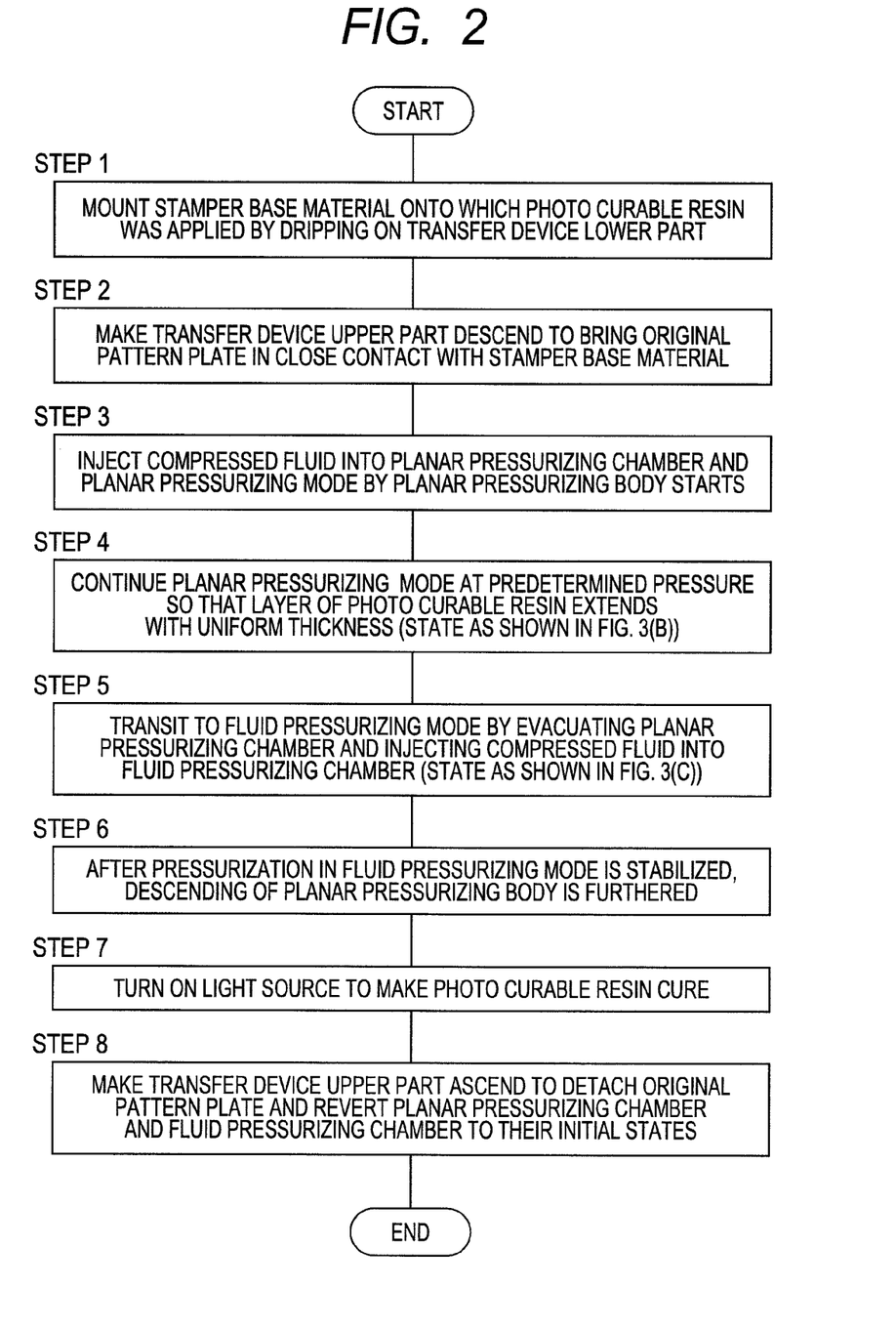
FIG. 2 illustrates an operation flowchart for the first embodiment of the imprinting apparatus of the present invention.
Figure 3A:
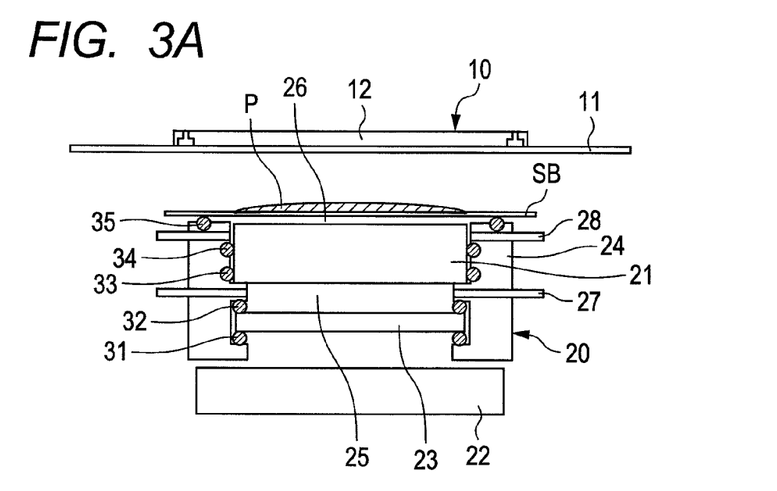
FIGS. 3A to 3C show states of the imprinting apparatus in representative positions during the operation flow illustrated in FIG. 2.
Figure 3B:
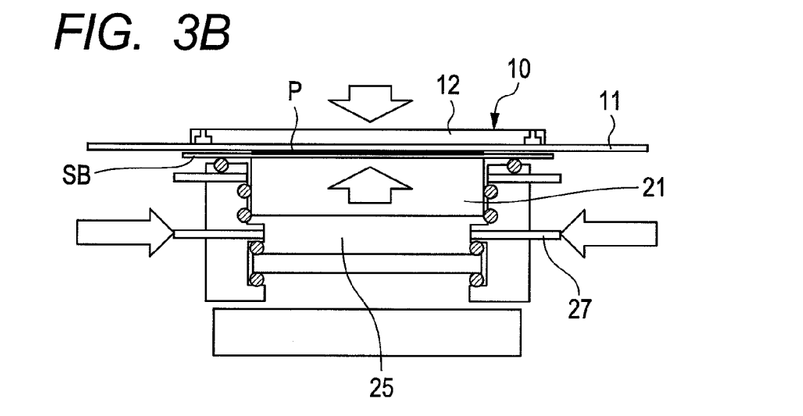
Figure 3C:
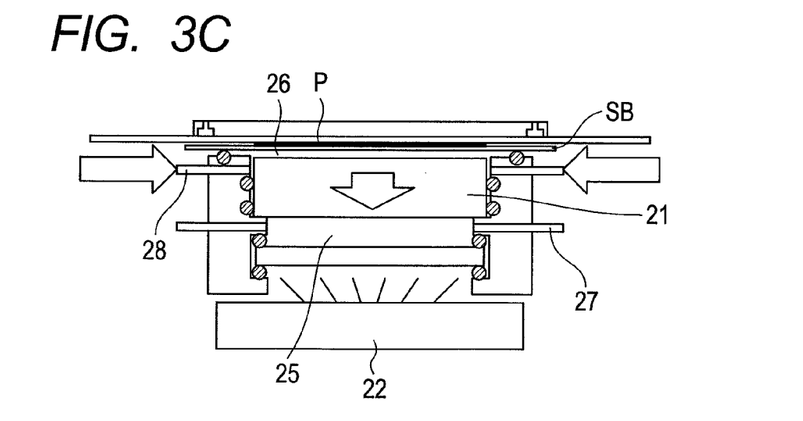
Figure 4:
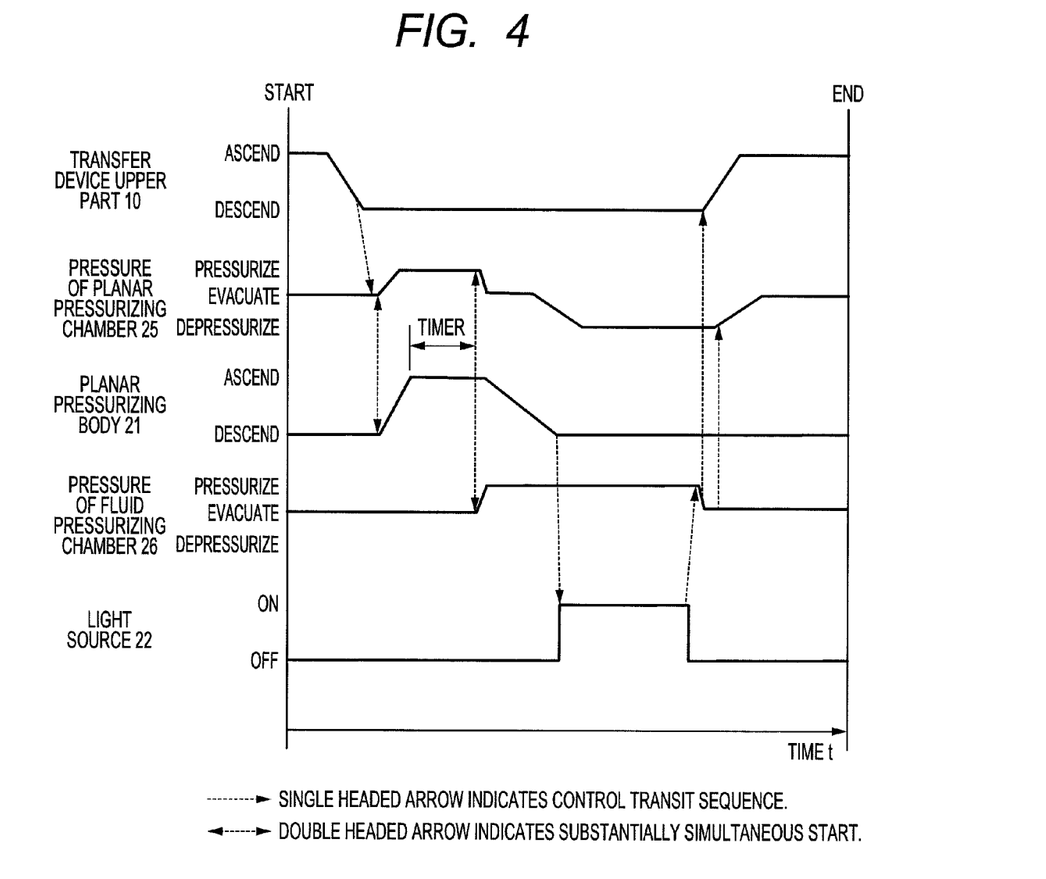
FIG. 4 shows a timing chart relevant to the operation flow illustrated in FIG. 2.

Then, operation of the imprinting apparatus Ip of the first embodiment is described, using FIG. 2, FIGS. 3A to 3C, and FIG. 4. FIG. 2 illustrates an operation flowchart of the imprinting apparatus Ip of this embodiment. FIGS. 3A to 3C show states of the imprinting apparatus Ip in representative positions during the operation flow illustrated in FIG. 2. FIG. 4 shows a timing chart relevant to the above operation flow. In FIG. 4, the ordinate indicates possible positions of the transfer device upper part 10 and the planar pressurizing body 21 and operation states of the planar pressurizing chamber 25, the fluid pressurizing chamber 26, and the light source 22, and the abscissa indicates time t.

In the following, operation of the imprinting apparatus Ip of this embodiment is described mainly based on the operation flowchart of FIG. 2, while referring to FIG. 3A to FIG. 4.

Step 1: The stamper base material SB onto which a photo curable resin P is applied by dripping in its center region during a preceding process is mounted in a stationary portion of the transfer device lower part 20 positioned to face the original pattern plate 11 suctioned and secured to the suction plate 12 of the transfer device upper part 10 (state as shown in FIG. 3A). FIG. 3A is the same as FIG. 1.

Step 2: As indicated in the timing chart of FIG. 4 (hereinafter simply referred to as the chart), the transfer device upper part 10 having the suction plate 12 and the original pattern plate 11 is made to descend so as to bring the original pattern plate 11 in close contact with the stamper base material SB with the photo curable resin P being sandwiched therebetween. At this time, the photo curable resin P sandwiched between the original pattern plate 11 and the stamper base material SB is pressed to extend as a thin layer, but does not yet become a layer with a sufficiently uniform thickness.

Step 3: As indicated in the chart of FIG. 4, somewhat later, compressed fluid is injected from the piping for planar pressurization 27 as indicated in FIG. 3B into the planar pressurizing chamber 25. A planar pressurizing mode starts in which the planar pressurizing body 21 is pushed up and the photo curable resin P is planar pressurized by the planar pressurizing body 21.

Step 4: As indicated in the chart of FIG. 4, the planar pressurizing mode is continued such that, once a predetermined pressure has been reached, this pressure is maintained for a timer period until the layer of the photo curable resin P extends with a predetermined uniform thickness (state as shown in FIG. 3B).

Step 5: As indicated in the chart of FIG. 4, the planar pressurizing chamber 25 is evacuated by drawing in the compressed fluid through the piping for planar pressurization 27 at a controlled speed and, at approximately the same time, compressed fluid is injected from the piping for fluid pressurization 28 into the fluid pressurizing chamber 26. As a result, the planar pressurizing body 21 descends, but the press force of the planar pressurizing body 21 exerted on the stamper base material SB is replaced by the pressurization force of the compressed fluid injected from the piping for pressurization 28 without delay. The operation thus transits to a fluid pressurizing mode in which pressurization is only performed by the compressed fluid, while the layer of the photo curable resin P remains having the predetermined (sufficiently) uniform thickness (state as shown in FIG. 3C).

Step 6: As indicated in the chart of FIG. 4, after the pressurization onto the stamper base material SB in the fluid pressurizing mode is stabilized, the planar pressurizing chamber 25 is depressurized and the descending of the planar pressurizing body 21 is furthered.

Step 7: As indicated in the chart of FIG. 4, when the planar pressurizing body 21 has come to a predetermined position, the light source 22 is turned on and remains on for a given time to expose the photo curable resin P to the light and make the resin cure. At this time, even if there are minute flaws, smudges, or foreign matters on the surface of the planar pressurizing body 21, their shadows have no effect on the exposure, as the planar pressurizing body 21 keeps a sufficient distance from the photo curable resin P. Thus, it is possible to allow the photo curable resin P to cure with even energy intensity.

Step 8: As indicated in the chart of FIG. 4, the transfer device upper part 10 which supports the suction plate 12 is made to ascend so as to detach the original pattern plate 11 from the stamper base material SB and the planar pressurizing chamber 25 and the fluid pressurizing chamber 26 are reverted to their initial states.

Subsequently, steps 1 to 8 are repeated.

According to the first embodiment described above, it is possible to provide the pressurization mechanism and method that enable smooth switching from planar pressurization to fluid pressurization, while maintaining the pressurization onto the stamper base material SB at a predetermined pressure. In consequence, what is feasible is steady manufacturing of better quality stampers provided with an imprint pattern layer free of defects and having a uniform thickness, which would be difficult to produce with previously existing technology, by combining both the advantages of the publicly known two types of pressurization methods, as previously stated, and solving their disadvantages.

Figure 5:
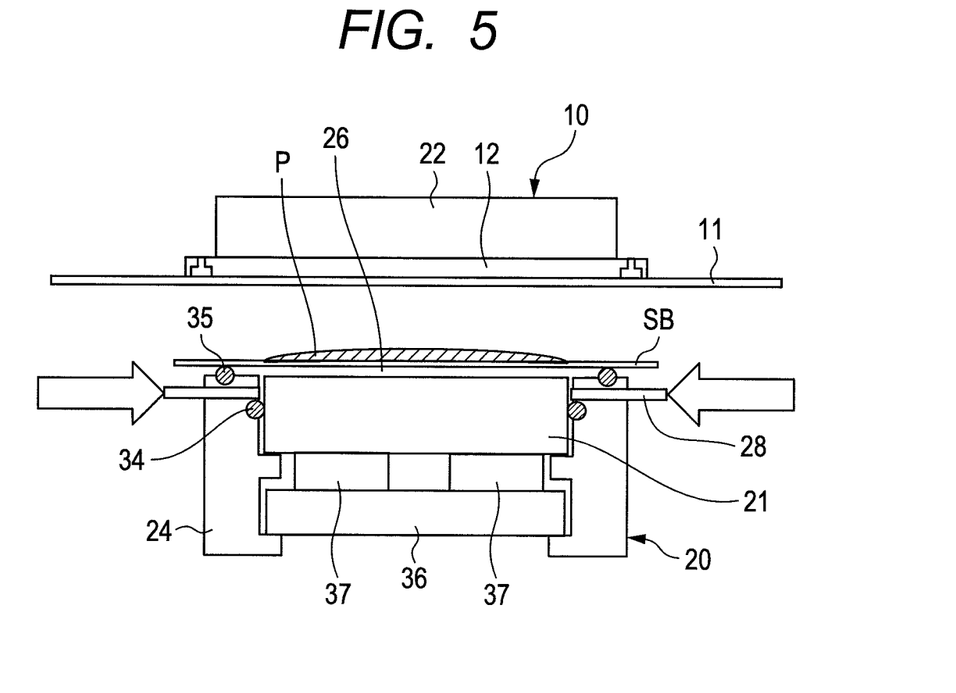
FIG. 5 shows a structural diagram of a second embodiment of an imprinting apparatus of the present invention.

FIG. 5 shows a structural diagram of a second embodiment of an imprinting apparatus Ip. Difference from the first embodiment lies in two respects as will be described below. In FIG. 5, components corresponding to those in FIG. 1 in terms of structure and function are marked with the same reference numerals as in FIG. 1.

Firstly, in the first embodiment, the light source 22 is provided in the transfer device lower part 20 and irradiates the photo curable resin P with UV light from below, whereas, in the second embodiment, the light source 22 irradiates the resin with UV light from above the suction plate 12 in the transfer device upper part 10. For this reason, the suction plate is made of a material that is transmissive for UV light, e.g., glass. On the other hand, the planar pressurizing body 21 does not need to be glass.

Secondly, in the first embodiment, the planar pressurizing body is driven by compressed fluid, whereas, in the second embodiment, an air cylinder 37 is provided between an air-driven base 36 and the planar pressurizing body 21 and drives the planar pressurizing body. In this case, the planar pressurizing body 21 may not need to be a transparent glass body.

The operation flow for the second embodiment is basically the same as described previously. However, in order to ensure transition from the planar pressurizing mode to the fluid pressurizing mode, pressure exerted by the planar pressurizing body 21 may be controlled by the air cylinder 36, while the pressure of the fluid pressurizing chamber 26 is monitored.

According to the second embodiment described above, it is possible to provide the pressurization mechanism and method that enable smooth switching from planar pressurization to fluid pressurization, while maintaining the pressurization onto the stamper base material SB at a predetermined pressure. In consequence, what is feasible is steady manufacturing of better quality stampers provided with an imprint pattern layer free of defects and having a uniform thickness, which would be difficult to produce with previously existing technology, by combining both the advantages of the publicly known two types of pressurization methods, as previously stated, and solving their disadvantages.

In the second embodiment described above, it is assumed that, if a pattern is imprinted onto the top surface of the transferred object, pressure is exerted on the reverse surface of the transferred object by the fluid pressurizing body and the compressed fluid, as is the case for the first embodiment. However, the pressure may be exerted on the reverse surface of the stamper that is the original pattern plate by the fluid pressurizing body and the compressed fluid.

Figure 6A:
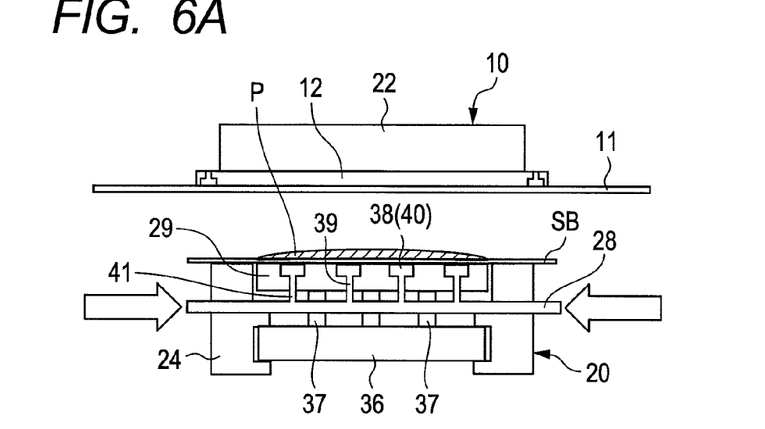
FIGS. 6A to 6C show a structural diagram of a third embodiment of an imprinting apparatus of the present invention and states of the imprinting apparatus in representative positions.
Figure 6B:
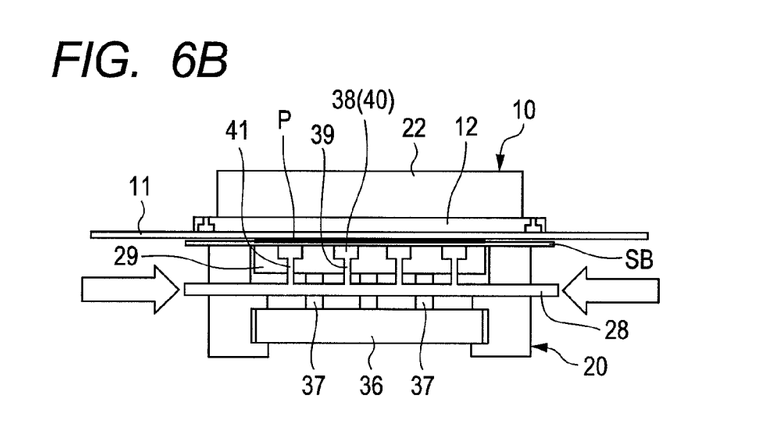
Figure 6C:
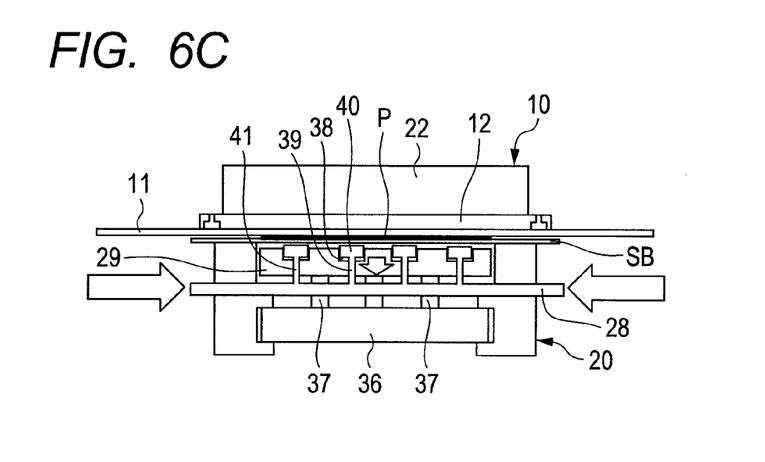

FIGS. 6A to 6C show a structural diagram of a third embodiment of an imprinting apparatus Ip. FIGS. 6A, 6B, and 6C correspond to FIGS. 3A, 3B, and 3C. In FIGS. 6A to 6C, components corresponding to those in FIGS. 3A to 3C in terms of structure and function are marked with the same reference numerals as in FIGS. 3A to 3C.

What is different in structure from the second embodiment is described, using FIG. 6A. The third embodiment is the same as the second embodiment in that a planar pressurizing body 29 is driven by the air cylinder 37. However, the structure for fluid pressurization differs from the second embodiment. Other structures are basically the same as the second embodiment. The planar pressurizing body 29 includes plural trenches 38 with a predetermined height in its pressurizing surface and through holes 39 communicating with the trenches. On the other hand, the fluid pressurizing portion includes nozzles 40 which can be inserted in the trenches and have approximately the same height as the predetermined height of the trenches, connecting tubes 41 provided in the through holes 39, and piping for fluid pressurization 28 which supplies compressed fluid to the connecting tubes 41.

By virtue of such structure, the third embodiment has a characteristic operation flow as will be described below.

FIG. 6B illustrates a state that the transfer device upper part 10, after descending, has come in close contact with the stamper base material SB, the planar pressurizing body 29 is being pressurized upward by air cylinder 37, and the photo curable resin P is planar pressurized. Depending on the size of the trenches 38, uniformity of the thickness of the imprint pattern layer may deteriorate. In such case, by injecting the compressed fluid into all the nozzles 40, pressure is exerted on the photo curable resin P in the locations of the trenches 38 to an extent that provides pressurization equivalent to the planar pressurizing body 29 or avoids the deterioration of uniformity.

FIG. 6C illustrates an aspect at the time of switching from the planar pressurizing mode to the fluid pressurizing mode using only the compressed fluid. By the air cylinder 37, the planar pressurizing body 29 descends to such a position that, even if there are minute flaws, smudges, or foreign matters on its surface, their shadows have no effect on the exposure. In an initial period of the descending, the amount of the compressed fluid being supplied to all the nozzles is increased so that the press force of the planar pressurizing body 29 exerted on the stamper base material SB is replaced by the pressurization force of the compressed fluid without delay.

In the third embodiment described above, it is assumed that, if a pattern is imprinted onto the top surface of the transferred object, pressure is exerted on the reverse surface of the transferred object by the fluid pressurizing body and the compressed fluid, as is the case for the first and second embodiments. However, the pressure may be exerted on the reverse surface of the stamper that is the original pattern plate.

The third embodiment having the above-described structure and operating flow can also achieve the same advantages effects as in the first and second embodiments.

What is claimed is:

1. An imprinting apparatus comprising: a stamper having a concavo-convex configuration on a surface thereof; an transferred object, onto a surface of which the concavo-convex configuration is transferred; and an energy source which irradiates the transferred object with energy, wherein the imprinting apparatus is arranged to detach the stamper from the transferred object, the imprinting apparatus comprising:
    planar pressurizing means which pressurizes a first reverse surface of at least one of the stamper and the transferred object with a planar pressurizing body having a flat surface configuration; fluid pressurizing means which pressurizes a second reverse surface of at least one of the stamper and the transferred object with a fluid; and control means which controls timing of pressurization by the planar pressurizing means and the fluid pressurizing means, wherein the control means implements control to maintain the pressurization approximately at a predetermined pressure when transition from the planar pressurizing means to the fluid pressurizing means takes place.

2. The imprinting apparatus according to claim 1, wherein the energy source is a heat source or a light source.

3. The imprinting apparatus according to claim 1, wherein the first reverse surface and the second reverse surface are an identical reverse surface.

4. The imprinting apparatus according to claim 3, wherein the identical reverse surface is a reverse surface of the stamper.

5. The imprinting apparatus according to claim 3, wherein the identical reverse surface is a reverse surface of the transferred object.

6. The imprinting apparatus according to claim 1, wherein the first reverse surface and the second reverse surface are different reverse surfaces.

7. The imprinting apparatus according to claim 6, wherein the first reverse surface is the reverse surface of the stamper and the second reverse surface is the reverse surface of the transferred object.

8. The imprinting apparatus according to claim 6, wherein the first reverse surface is the reverse surface of the transferred object and the second reverse surface is the reverse surface of the stamper.

* * * * *